(12) United States Patent  
Chakravarti et al.

(10) Patent No.: US 8,236,710 B2
(45) Date of Patent: Aug. 7, 2012

(54) TECHNIQUE TO CREATE A BURIED PLATE IN EMBEDDED DYNAMIC RANDOM ACCESS MEMORY DEVICE

(75) Inventors: Ashima B. Chakravarti, Hopewell Junction, NY (US); Jacob B. Dadson, Wappingers Falls, NY (US); Paul J. Higgins, Hopewell Junction, NY (US); Babar A. Khan, Ossining, NY (US); John J. Moore, Highland, NY (US); Christopher C. Parks, Poughkeepsie, NY (US); Rohit S. Takalkar, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/899,638

(22) Filed: Oct. 7, 2010

(65) Prior Publication Data
US 2012/0086103 A1      Apr. 12, 2012

(51) Int. Cl.
*H01L 21/76*     (2006.01)
(52) U.S. Cl. ........ 438/957; 438/745; 438/427; 438/422; 438/389; 438/246; 438/268; 438/733; 438/434; 438/433; 438/430; 438/561; 438/564; 257/E27
(58) Field of Classification Search .................. 438/427, 438/751, 422, 749, 957, 389, 246, 430, 433, 438/434, 268, 561, 564; 257/304, E27, 532
See application file for complete search history.

(56) References Cited

U.S. PATENT DOCUMENTS

| | | | |
|---|---|---|---|
| 5,679,596 A | 10/1997 | Lu | |
| 6,271,125 B1 | 8/2001 | Yoo et al. | |
| 6,413,844 B1 | 7/2002 | Beulens et al. | |
| 6,436,763 B1 | 8/2002 | Huang et al. | |
| 6,770,526 B2 | 8/2004 | Chudzik et al. | |
| 6,806,138 B1 | 10/2004 | Cheng et al. | |
| 7,041,553 B2 | 5/2006 | Kangguo et al. | |
| 7,521,748 B2 | 4/2009 | Fleming, Jr. et al. | |
| 2001/0016398 A1* | 8/2001 | Kudelka et al. | 438/427 |
| 2003/0045119 A1* | 3/2003 | Wang et al. | 438/745 |
| 2005/0285175 A1* | 12/2005 | Cheng et al. | 257/302 |
| 2006/0124982 A1* | 6/2006 | Ho et al. | 257/304 |
| 2008/0064178 A1* | 3/2008 | Ho et al. | 438/389 |

FOREIGN PATENT DOCUMENTS

EP      0 905 760 A2     3/1999

OTHER PUBLICATIONS

R. E. Matick et al., "Logic-based eDRAM: Origins and rationale for use," IBM J. Res. & Dev., vol. 49, No. 1, 2005, pp. 145-165.
L. Economikos et al., "Study of Arsenic Out-diffusion for Buried Plate Formation in Trench Capacitors," Twenty-Third IEEE/CPMT, 1998, pp. 423-432.

* cited by examiner

*Primary Examiner* — Marc Armand
(74) *Attorney, Agent, or Firm* — Scully, Scott, Murphy & Presser, P.C.; Katherine S. Brown, Esq.

(57) ABSTRACT

A method for forming a trench structure is provided for a semiconductor and/or memory device, such as an DRAM device. In one embodiment, the method for forming a trench structure includes forming a trench in a semiconductor substrate, and exposing the sidewalls of the trench to an arsenic-containing gas to adsorb an arsenic containing layer on the sidewalls of the trench. A material layer is then deposited on the sidewalls of the trench to encapsulate the arsenic-containing layer between the material layer and sidewalls of the trench.

17 Claims, 6 Drawing Sheets

TECHNIQUE TO CREATE A BURIED PLATE IN EMBEDDED DYNAMIC RANDOM ACCESS MEMORY DEVICE

BACKGROUND

The present disclosure generally relates to the field of fabricating dynamic random access memory (DRAM) devices, such as embedded DRAM devices.

Embedded DRAM devices may include trench capacitors. A trench capacitor is a three dimensional device that can be formed by etching a trench into a semiconductor substrate. After trench etching, a buried plate electrode, also referred to as a diffusion plate, is typically formed about the exterior portion of the trench and a node dielectric is then formed on the inner walls of the trench. Next, the trench is filled, for example, with doped polysilicon, such as N-type polycrystalline silicon ("N-type Poly-Si"). The doped poly-Si serves as one electrode of the capacitor, often referred to as the upper electrode or storage node, and the buried plate electrode serves as a second electrode of the capacitor, often referred to as the lower electrode. A node dielectric separates the buried plate and the upper electrode, and serves as the insulating layer of the trench capacitor.

SUMMARY

A method for forming a trench structure is provided for a semiconductor and/or memory device, such as an embedded DRAM device. In one embodiment, the method for forming a trench structure includes forming a trench in a semiconductor substrate, and exposing the sidewalls of the trench to an arsenic-containing gas to deposit an arsenic containing layer on the sidewalls of the trench. A material layer is then formed on the sidewalls of the trench to encapsulate the arsenic-containing layer between the material layer and the sidewalls of the trench.

In another embodiment, a method of forming a trench capacitor is provided that includes forming a trench in a semiconductor substrate and exposing the sidewalls of the trench to an arsenic-containing gas to deposit an arsenic-containing layer on the sidewalls of the trench. A material layer is then formed on the sidewalls of the trench to encapsulate the arsenic between the material layer and sidewalls of the trench. The arsenic from the arsenic-containing layer is driven into the semiconductor substrate to form a lower plate electrode. A node dielectric can be formed on the lower plate electrode. The trench may be filled with an upper electrode.

In another aspect, a memory device is provided that includes a trench present in a semiconductor substrate. A capacitor is present in the trench that includes a buried plate electrode having a uniform arsenic concentration throughout an entirety of the buried plate electrode. A pass transistor is in electrical communication with the capacitor.

DESCRIPTION OF THE SEVERAL VIEWS OF THE DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION

Figure 1:
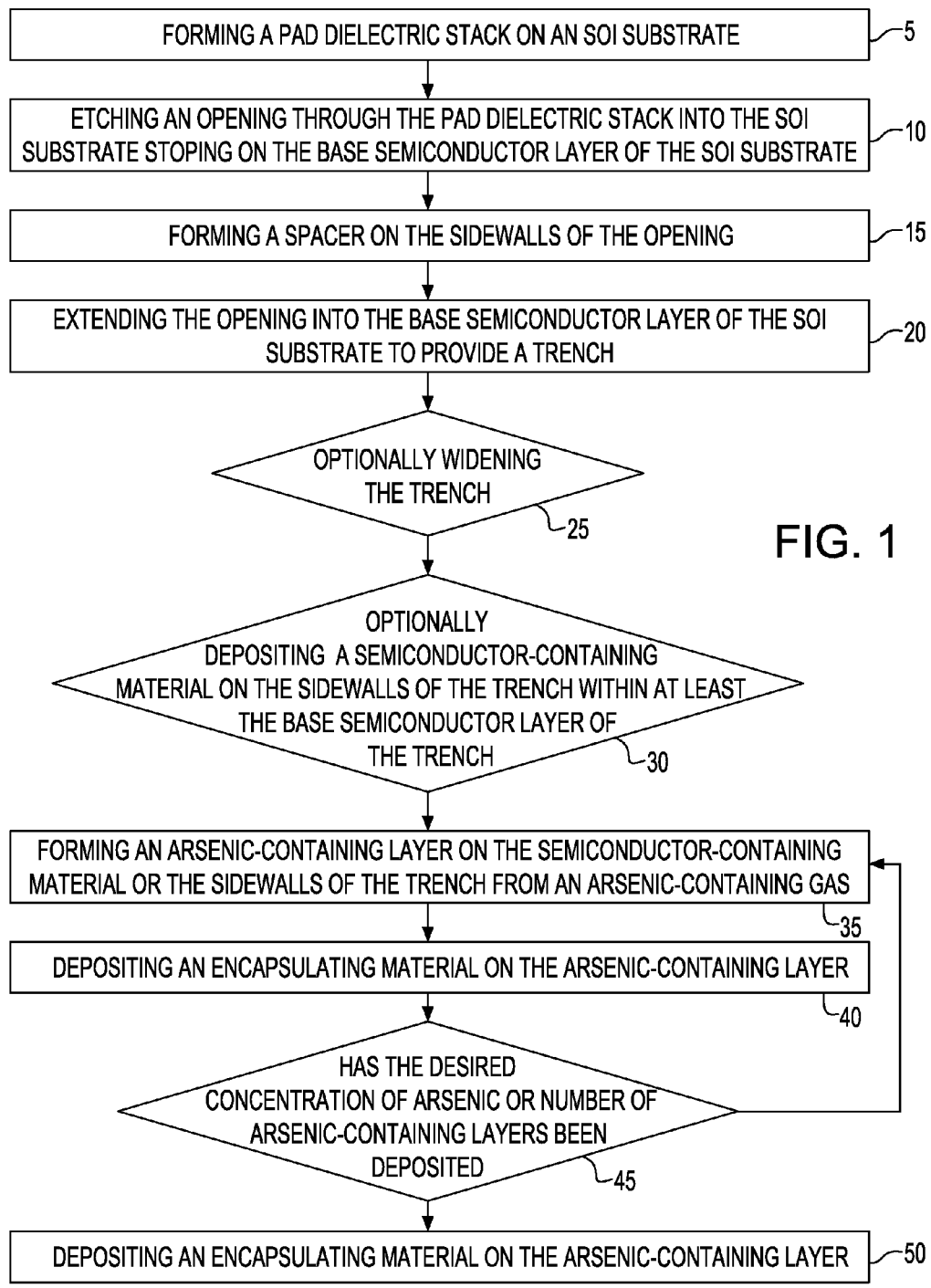
FIG. 1 is a flow chart illustrating the process flow of one embodiment of the present disclosure.

Detailed embodiments of the present disclosure are disclosed herein; however, it is to be understood that the disclosed embodiments are merely illustrative and may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the embodiments of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The embodiments of the present disclosure relate to methods for producing a buried plate electrode in a high aspect ratio (height to width ratio) trench. A trench with a high aspect ratio is a trench having an aspect ratio that is greater than 5:1. A buried plate electrode is an electrode that is formed in the sidewalls and base surfaces of the trench. The term "electrode" as used to describe a component of the capacitor represents one of at least two electrically conductive materials of the capacitor that are separated by a dielectric layer, e.g., node dielectric layer.

It has been determined that buried plate electrodes formed by depositing an arsenic-containing glass layer on the sidewalls of the trench and diffusing the arsenic from the arsenic-containing glass layer into the sidewalls of the trench with an anneal, can not adequately provide coverage of the trench's entire sidewall in a high-aspect ratio trench. This is because the spin-on-glass methods that are used to deposit the arsenic-containing glass within the trench close the opening of high aspect ratio trenches prior to adequate coverage of base and sidewall surfaces of the trench. Buried plate electrodes that are formed by ion implantation are also deficient in introducing arsenic to the entirety of the sidewalls of high aspect ratio trenches. Angled ion implantation can not implant the upper portion of high aspect ratio trenches with the same uniformity as the lower portion of the high aspect ratio trench, especially when interlevel dielectric layers are present on the surface of the substrate, in which the trench has been formed.

In one embodiment, the method of the present disclosure provides complete coverage of the walls, i.e., base and sidewall surfaces, of high aspect ratio trenches by applying an arsenic-containing layer to the trench sidewalls with an arsenic-containing gas. Following the application of the arsenic-containing gas, a material layer (hereafter referred to as an encapsulating layer) may be deposited encapsulating the arsenic between the sidewalls of the trench and the material layer. An anneal is performed to drive the arsenic into the sidewalls of the high aspect ratio trench. FIGS. 1-9 depict one embodiment of the aforementioned method. FIG. 1 is a flow chart illustrating the process flow of one embodiment of the present method. The process flow illustrated in FIG. 1 is for illustrative purposes only and is not intended to limit the disclosed method to the process steps listed, because preceding and intermediate process steps that are not illustrated in FIG. 1 have been contemplated and are within the scope of the present disclosure.

Figure 2:
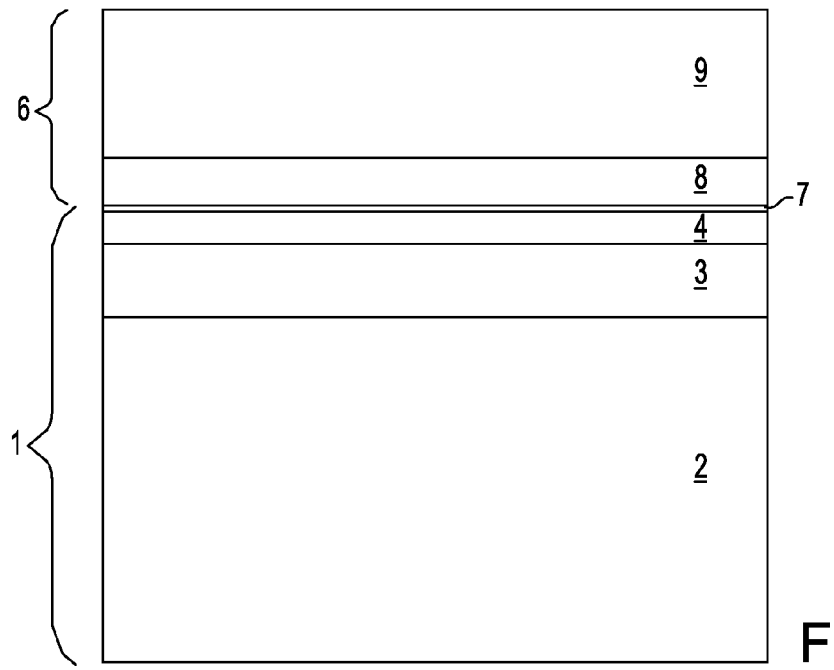
FIG. 2 is a side cross-sectional view depicting a semiconductor on insulator substrate (SOI) substrate having a pad dielectric stack disposed thereon, in accordance with the present disclosure.

Referring to FIG. 1, and in some embodiments, the method may begin with the step 15 of forming a pad dielectric stack 6 on a semiconductor substrate 1. FIG. 2 depicts a semiconductor substrate 1, e.g., SOI substrate. In one example, at least one dielectric layer, e.g., pad dielectric stack 6, may be present on an upper surface of the semiconductor substrate 1. In the example depicted in FIG. 2, the semiconductor substrate 1 is a semiconductor on insulator (SOI) substrate including a first semiconductor layer 4 (hereafter also referred to as a semiconductor on insulator (SOI) layer 4), such as a silicon-containing semiconductor layer, located on a surface of a buried dielectric layer 3, such as a buried oxide layer. The first semiconductor layer 4 typically has a thickness greater than 10 nm. The buried dielectric layer 3 typically has a thickness ranging from 10 nm to 100 nm. In another embodiment, the buried dielectric layer 3 ranges from 20 nm to about 80 nm. Underlying the buried dielectric layer 3 is a lower semiconductor layer, i.e., second semiconductor layer 2 (hereafter also referred to as a base semiconductor layer 2), which may be composed of a Si-containing material, and may have a thickness ranging from 10 nm to 500 nm.

The SOI layer 4 and/or the base semiconductor layer 2 may include any semiconductor material including, but not limited to; Si, Ge, SiGe, GaAs, InAs, InP, or other III/IV compounds. The SOI layer 4 and/or the base semiconductor layer 2 may be doped with P or N-type dopants or may be undoped. In particular, the SOI layer 4 and/or the base semiconductor layer 2 may be lightly doped with P-type dopants, such as boron. The SOI layer 4 and/or the base semiconductor layer 2 may contain various isolation and/or active device regions. For clarity, such regions are not shown in the drawings, but are nevertheless meant to be included within the SOI layer 4 and/or the base semiconductor layer 2. The buried dielectric layer 3 may be any dielectric material, such as an oxide, nitride or oxynitride. In one example, the buried dielectric layer 3 is composed of silicon oxide.

The SOI substrate 1 may be formed using a bonding process, or it may be formed using an ion implantation process. In one embodiment, the SOI substrate can be a bonded substrate comprised of two semiconductor wafers that are bonded together. The two wafers used in fabricating the bonded substrate may include two SOI wafers, wherein one of the wafers includes the SOI layer 4. One of the two wafers includes a dielectric layer present thereon, which is to be positioned between the SOI layer 4 and the base semiconductor layer 2 to provide the buried dielectric layer 3 of the semiconductor (SOI) substrate. Bonding can be achieved by first bringing the two wafers into intimate contact with other, optionally applying an external force to the contacted wafers, and then heating the two contacted wafers under conditions that are capable of bonding the two wafers together. The heating step may be performed in the presence or absence of an external force. In one embodiment, the heating step is typically performed in an inert ambient at a temperature of from 600° to 1300° C. for a time period of from 2 to 20 hours. In another embodiment, the bonding is performed at a temperature of from 900° to 1200° C. for a time period of from 2 hours to 20 hours. The term "inert ambient" is used herein to denote an atmosphere in which an inert gas, such as He, Ar, $N_2$, Xe, Kr or a mixture thereof, is employed.

Although the semiconductor substrate 1 depicted in FIG. 2 is an SOI substrate, the semiconductor substrate 1 may be a bulk semiconductor substrate. The bulk semiconductor substrate may be any semiconductor material including, but not limited to, Si, Ge, SiGe, GaAs, InAs, InP, or other III/IV compounds.

The pad dielectric stack 6 includes at least one dielectric layer. The pad dielectric stack 6 may be formed on the surface of the semiconductor substrate 1 using deposition and/or thermal growth processes. The pad dielectric stack 6 can serve as an etch mask during formation of at least one trench in the semiconductor substrate 1. The pad dielectric stack 6 may comprise a single pad dielectric layer, or the pad dielectric stack 6 may comprise a multi-layered structure. For example, the pad dielectric stack 6 may comprise an oxide, a nitride, or a doped silicate glass material, or two or more of the aforementioned materials may be employed.

In the example depicted in FIG. 2, the pad dielectric stack 6 includes a first pad dielectric layer 7, e.g., a pad oxide layer, a second pad dielectric layer 8, e.g., a pad nitride layer, and a third pad dielectric layer 9, e.g., a high density plasma (HDP) chemical vapor deposition (CVD) deposited oxide. When the first pad dielectric layer 7 is composed of a pad oxide layer, the pad oxide layer may be silicon oxide having a thickness ranging from 1 nm to 10 nm. When the second pad dielectric layer 8 is composed of a pad nitride layer, the pad nitride layer may be silicon nitride having a thickness ranging from 10 nm to 200 nm. When the third pad dielectric layer 9 is composed of HDPCVD oxide, the HDPCVD oxide may be silicon oxide having a thickness ranging from 10 nm to 1500 nm.

Figure 3:
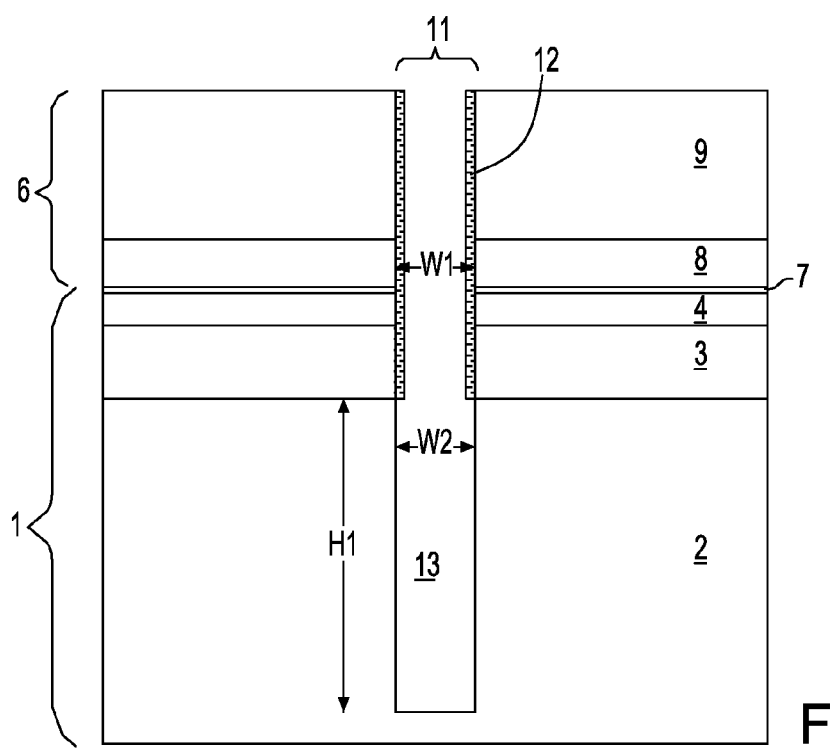
FIG. 3 is a side cross-sectional view depicting forming an opening in the pad dielectric stack, the SOI layer of the substrate, and the buried dielectric layer of the substrate, in accordance with one embodiment of the present disclosure.

Referring to FIGS. 1 and 3, in a following step 10, a opening 11 is etched through the pad dielectric stack 6 into the SOI substrate, i.e., semiconductor substrate 1, stopping on the base semiconductor layer 2. Referring to FIG. 3, the pad dielectric stack 6 can be patterned using lithography and etching. A photolithographic mask (not shown) is produced, by applying a photoresist layer (not shown) on the exposed surface layer of the surface to be etched utilizing a conventional deposition process. The photoresist layer is then patterned utilizing conventional lithography so as to expose selective regions of the pad stack in which trenches are to be formed. The lithography step includes exposing the photoresist to radiation to form a pattern in the photoresist and developing the pattern. The pattern (not shown) is then transferred into the layer of the pad dielectric stack 6 using a conventional etching process, such as reactive-ion etching (RIE), ion beam etching, or plasma etching that is highly selective in removing pad material as compared to photoresist.

FIG. 3 depicts forming at least one opening 11 through the pad dielectric stack 6 and the SOI layer 4 and the buried dielectric layer 3 of the semiconductor substrate 1. In one embodiment, the opening 11 is first formed in the pad dielectric stack 6 to expose a portion, i.e., exposed portion, of the semiconductor substrate 1, i.e., SOI substrate. Thereafter, the exposed portion of the semiconductor substrate 1 is etched. Although, FIG. 3 depicts etching through the SOI layer 4 and the buried dielectric layer 3 stopping on the upper surface of the base semiconductor layer 2, embodiments are contemplated where the opening 11 is provided by etching through the SOI layer 4 and through the upper surface of the base semiconductor layer 2.

The opening 11 may be formed using an etch process, such as an anisotropic etch process. As used herein, an "anisotropic etch process" denotes a material removal process in which the etch rate in the direction normal to the surface to be etched is higher than in the direction parallel to the surface to be etched. Etching of the at least one opening 11 into the SOI layer 4 of the semiconductor substrate 1 may be performed using a timed etch process step that is highly selective in removing the material of the SOI layer 4 of semiconductor substrate 1, as opposed to the material of the pad dielectric stack 6. Dry etching processes that may be used to form the at least one opening 11 include, but are not limited to reactive ion etch, ion-beam etching, plasma etching or any other like dry etch process. Reactive ion etching (RIE) is a form of plasma etching in which during etching the surface to be etched is exposed to reactive gases in the presence of an RF field. During RIE the surface to be etched takes on a potential that accelerates the reactive species extracted from a plasma toward the surface, in which the chemical etching reaction is taking place in the direction normal to the surface.

combination of the aforementioned dry etch processes may also be used in providing the at least one trench opening 11. In one embodiment, a first etch gas may remove the SOI layer 4 selective to the buried dielectric layer 3, wherein a second etch gas may remove the buried dielectric layer 3 selective to the base semiconductor layer 2. The width $W_1$ of each opening 11 may range from 30 nm to 250 nm. More typically, the width $W_1$ of each opening 11 may range from 50 nm to 200 nm. In one example, the width $W_1$ of each opening 11 is on the order of 100 nm.

Referring to FIGS. 1 and 3, in some embodiments, in a following step 15, a spacer 12 is formed on the sidewalls of the trench opening 11. The spacer 12 may be formed on the exposed sidewall of the SOI layer 4. The spacer 12 may be composed of a dielectric material such as a nitride, oxide, oxynitride or multilayers and combinations thereof. In one example, the spacer 12 can be composed of silicon nitride. The spacer 12 may be formed using a deposition process that forms a conformal layer on the deposition surface, i.e., sidewalls and base of the opening 11. As used herein, "conformal layer" is a deposited material having a thickness that remains the same regardless of the geometry of underlying features on which the layer is deposited, wherein the thickness of the layer does not deviate from greater than or less than 20% of an average value for the thickness of the layer. In one example, the material layer that provides the spacer 12 may be deposited using chemical vapor deposition (CVD). Chemical vapor deposition (CVD) is a deposition process in which a deposited species is formed as a result of a chemical reaction between gaseous reactants at greater than room temperature, wherein solid product of the reaction is deposited on the surface on which a film, coating, or layer of the solid product is to be formed. Variations of CVD processes suitable for providing the material layer for the spacer 12 include, but are not limited to, Atmospheric Pressure CVD (APCVD), Low Pressure CVD (LPCVD), Plasma Enhanced CVD (EPCVD), Metal-Organic CVD (MOCVD), and combinations thereof. In one embodiment, the material layer that provides the spacer 12 can be deposited on the sidewalls and the base of the trench. The portion of the material layer that provides the spacer 12 that is formed on the base may be removed by an etch process, such as an anisotropic etch, so that the remaining portion of the material layer that provides the spacer 12 is only present on the trench 13 sidewalls. In one embodiment, the anisotropic etch process that removes the base portion of the material layer that provides the spacer 12 is a reactive ion etch process. In another embodiment, the spacer 12 is provided on the exposed sidewall of the SOI layer 4 using a thermal oxidation process. In this embodiment, in which the SOI layer 4 is composed of silicon, the spacer 12 is composed of silicon oxide. The width of each spacer 12 may range from 1 nm to 25 nm. In one example, the width of each spacer 12 ranges from 5 nm to 20 nm.

Figure 4:
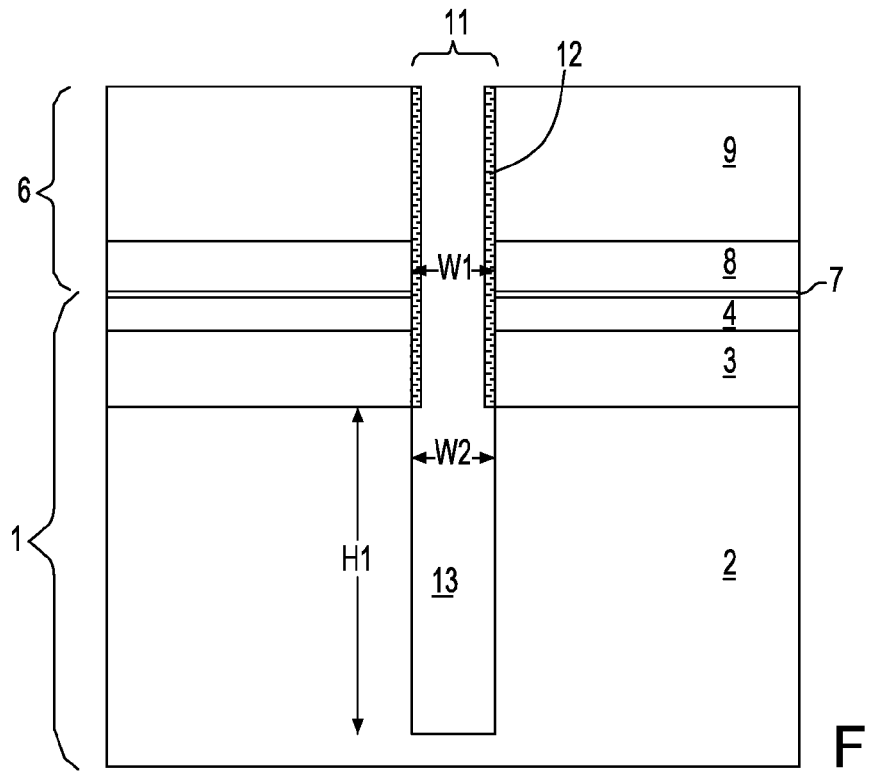
FIG. 4 is a side cross-sectional view depicting forming a trench in the lower semiconductor layer of the SOI substrate, in accordance with one embodiment of the present disclosure.

Referring to FIGS. 1 and 4, in a following step 20, the opening 11 is extended into the base semiconductor layer 2 of the semiconductor substrate 1, i.e., SOI substrate, to provide a trench 13. FIG. 4 depicts one embodiment of forming the trench 13 in the base semiconductor layer 2 of the semiconductor substrate 1, i.e., SOI substrate. In one embodiment, the trench 13 is an extension of the opening 11 into the base semiconductor layer 2 of the semiconductor substrate 1. Etching of the trench 13 into the base semiconductor layer 2 of the semiconductor substrate 1 may be performed using a timed etch process step that is highly selective in removing the material of the base semiconductor layer 2 of semiconductor substrate 1 as opposed to the material of the pad dielectric stack 6. Dry etching processes that may be used to form the trench 13 include, but are not limited to: RIE, ion-beam etching, plasma etching or any other like dry etch process. A combination of the aforementioned dry etch processes may also be used in providing the trench 13.

In one embodiment, the final depth $H_1$ of each trench 13, as measured from the top surface of the second semiconductor layer 2 is as great as 10 µm. The final depth $H_1$ trench 13, as measured from the top surface of the second semiconductor layer 2 of the semiconductor substrate 1, may also range from 1 µm to 7 µm. In one example, the final depth $H_1$ is on the order of about 3 µm. The aspect ratio (height to width ratio) of the trench 13 may range from 25:1 to 100:1. Even more typically, the aspect ratio ranges from 30:1 to 70:1.

Figure 5:
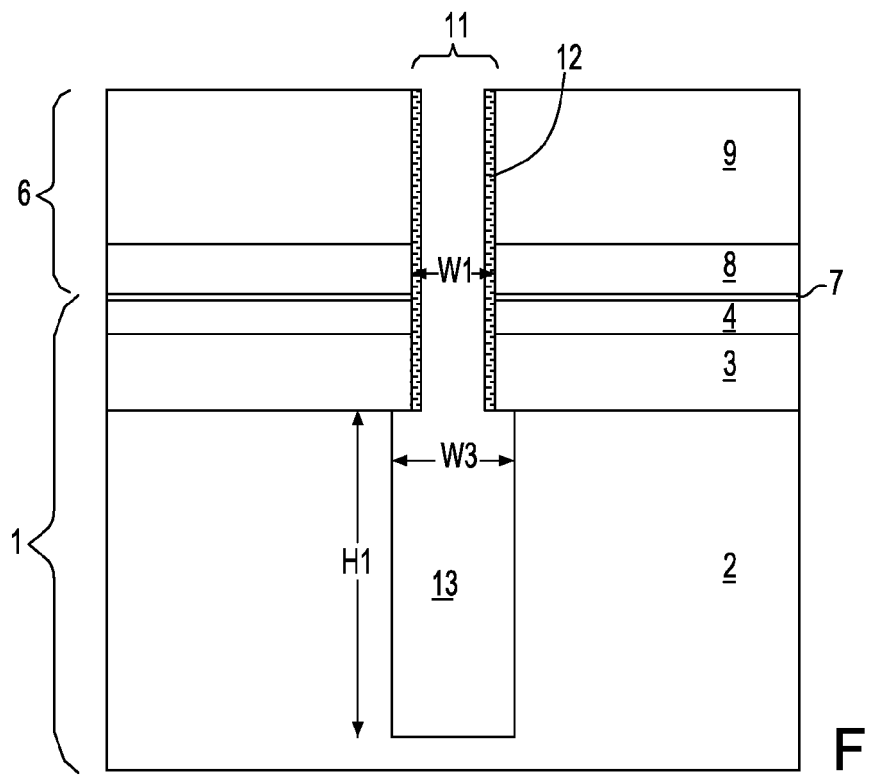
FIG. 5 is side cross-sectional views depicting widening the trench, in accordance with one embodiment of the present disclosure.

Referring to FIGS. 1 and 5, and in some embodiments, in a following optional step 25, the trench 13 may be widened. FIG. 5 depicts isotropically etching the trench 13, in which the isotropic etch increases at least the width of the trench 13 in the base semiconductor layer 2. More specifically, the isotropic etch increases the width $W_1$ of the trench 13 provided by the anisotropic etch and opening 11 that is described with reference to FIG. 3 to an enlarged width $W_3$ as depicted in FIG. 5. As opposed to anisotropic etch processes, an isotropic etch is not directional. In one embodiment, the isotropic etch that provides the enlarged width $W_3$ in the trench 13 may be referred to as a "bottle etch", which provides a trench 13 having a bottle shape. Such bottle-shaped trenches can be formed by an isotropic etch process which selectively removes semiconductor material in the lower region of the trench 13 but not the opening 11 at the upper region of the trench 13. In the present case, the isotropic etch removes the material of the base semiconductor layer 2 selective to the pad dielectric stack 6 and the buried dielectric layer 3. In one embodiment, the sidewall of the SOI layer 4 is protected during the isotropic etch by the spacer 8 that is present on the etched sidewalls of the SOI layer 4.

In one embodiment, the base semiconductor layer 2 is isotropically etched with a composition including hydrofluoric acid (HF) and ammonium hydroxide ($NH_4OH$) to obtain the bottle-shaped trench having an enlarged width $W_3$. In another embodiment, the base semiconductor layer 2 is isotropically etched to obtain a bottle-shaped trench having an enlarged width $W_3$. In one embodiment, the width $W_3$ of the trench 13 is enlarged to be greater than the width $W_1$ of the opening 11. In one example, the enlarged width $W_3$ of the trench 13 may range from 50 nm to 200 nm. In another example, the enlarged width $W_3$ of the trench 13 may range from 100 nm to 150 nm. It is noted that the widening of the trench 13 is optional, and may be omitted from the process flow of the present disclosure.

Figure 6:
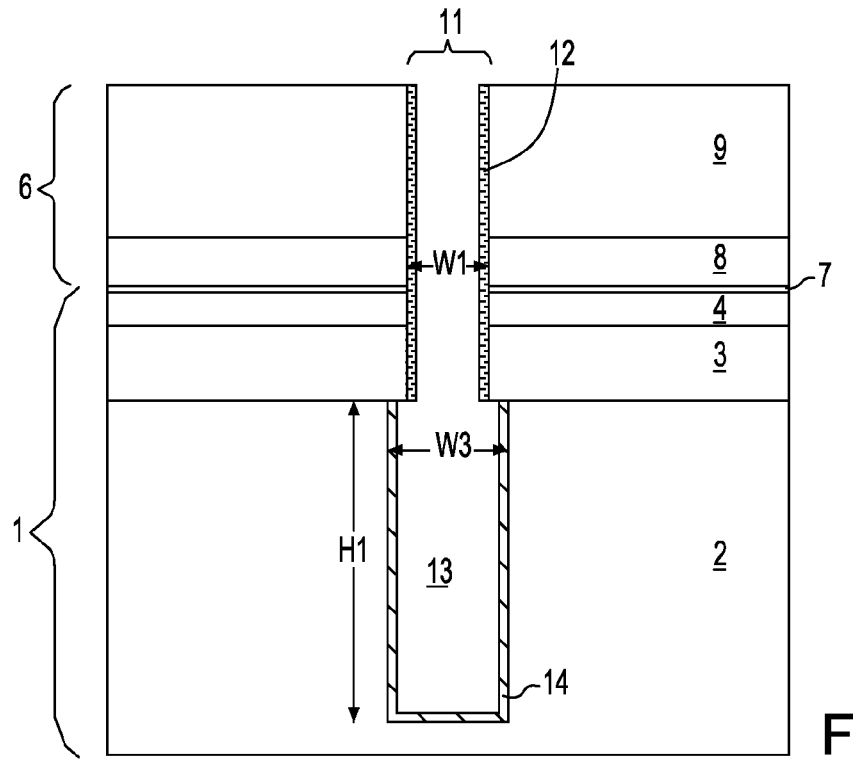
FIG. 6 is a side cross-sectional view depicting forming a semiconductor-containing material on the sidewalls of the trench, in accordance with one embodiment of the present disclosure.

Referring to FIGS. 1 and 6, and in some embodiments, in a following step 30, a semiconductor-containing material 14 is deposited on the sidewalls of the trench 13 within at least the base semiconductor layer 2 of the semiconductor substrate 1, i.e., SOI substrate. The deposition of the semiconductor-containing material 14 is optional, and may be omitted from the process sequence disclosed herein.

FIG. 6 depicts one embodiment of forming a semiconductor-containing material 14 on the sidewalls of the trench 13. The semiconductor-containing material 14 may be any semiconductor including, but not limited to, Si, Ge, SiGe or combinations thereof. In one embodiment, the semiconductor-containing material 14 is a silicon-containing material, such as silicon or silicon germanium. The semiconductor-containing material 14 may be deposited using chemical vapor deposition (CVD). Variations of CVD processes suitable for depositing the semiconductor-containing material 14 include, but are not limited to, Atmospheric Pressure CVD (APCVD), Low Pressure CVD (LPCVD), Plasma Enhanced CVD (EPCVD), Metal-Organic CVD (MOCVD), and combinations thereof.

In one example, in which the semiconductor-containing material 14 is silicon, the semiconductor-containing material 14 may be deposited from a semiconductor-containing gas that includes, but is not limited to, silicon tetrachloride, dichlorosilane ($SiH_2Cl_2$), and silane ($SiH_4$). In one embodiment, the flow rate of the semiconductor-containing gas ranges from 100 sccm to 1000 sccm. In another embodiment, the flow rate of the semiconductor-containing gas ranges from 200 sccm to 800 sccm. The semiconductor-containing gas is typically applied to the sidewalls of the trench 13 while the structure is at a temperature greater than 400° C. In one embodiment, the temperature of the structure containing the trench 13 is heated to a temperature ranging from 450° C. to 700° C. In another embodiment, the structure containing the trench 13 is heated to a temperature ranging from 525° C. to 575° C. The structure can be heated by a thermal furnace or oven.

The thickness of the semiconductor-containing material 14 deposited on the sidewalls of the trench 13 by the semiconductor-containing gas typically ranges from 5 Å to 50 Å. In another embodiment, the thickness of the semiconductor-containing material 14 that is deposited on the sidewalls of the trench 13 ranges from 10 Å to 30 Å. In yet another embodiment, the thickness of the semiconductor-containing material 14 deposited on the sidewalls of the trench 13 ranges from 10 Å to 20 Å. In one example, the semiconductor-containing material 14 that is deposited on the sidewalls of the trench 13 is silicon that is deposited from silane gas, wherein the thickness of the silicon ranges from 10 Å to 20 Å. The above process variables are illustrative of one form of batch chemical vapor deposition (CVD) equipment. The above variables may be modified in response to changes in the deposition equipment. For example, the deposition method that forms the semiconductor-containing material 14 may be a single wafer chemical vapor deposition tool.

Figure 7:
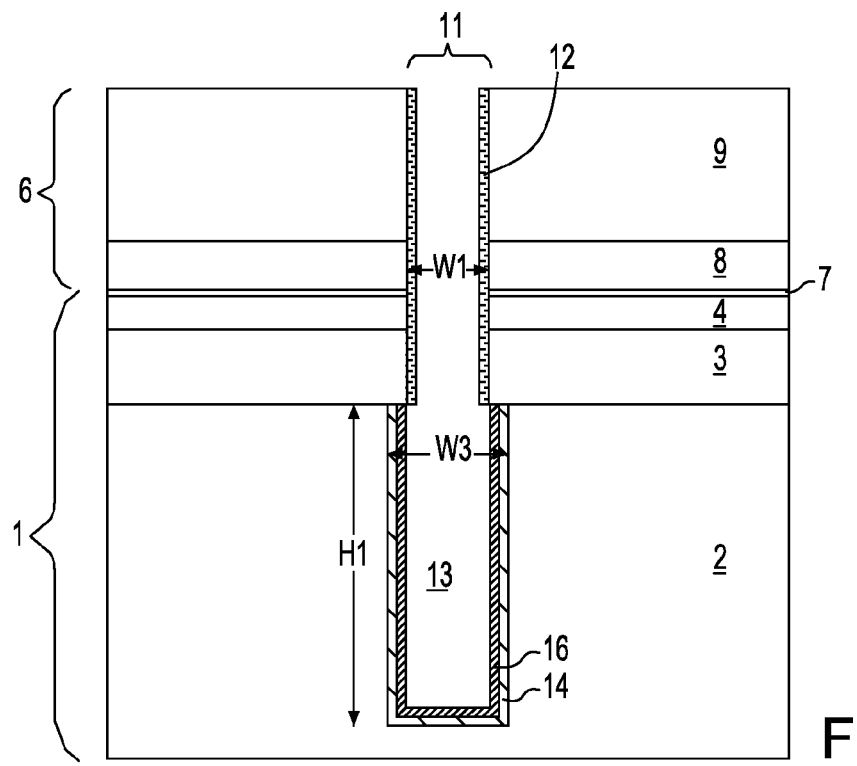
FIG. 7 is a side cross-sectional view depicting forming an arsenic-containing layer on the sidewalls of the trench including the semiconductor material, in accordance with one embodiment of the present disclosure.

Referring to FIGS. 1 and 7, and in a following step 35, an arsenic-containing layer 16 may be formed on the semiconductor-containing material 14. In the embodiments, in which the semiconductor-containing material 14 has been omitted, the arsenic-containing layer 16 may be formed on the sidewalls of the trench 13. By formed it is meant that an arsenic-containing layer 16 may be adsorbed onto the deposition surface. Adsorption is the process of attraction of atoms or molecules from an adjacent gas, e.g., arsenic-containing gas, to an exposed solid surface, e.g., the semiconductor-containing material 14 or the sidewalls of the trench 13. The attraction forces, e.g., van der Waals forces, align the molecules into layers, e.g., monolayers, onto the surface on which the material is being formed. In one example, at least one of van der Walls forces initiate the initial attraction of the adsorbed species, wherein ionic or metallic forces may bond the new monolayers to the surface on which the material is being adsorbed. For example, an arsenic-containing gas may form a monolayer of arsenic that is adsorbed to the surface on which the monolayer is formed, in which the monolayer includes atoms of arsenic that are bonded to silicon atoms of the surface of the semiconductor-containing material 14 or the sidewalls of the trench 13.

FIG. 7 depicts one embodiment of forming an arsenic-containing layer 16 that is adsorbed on the sidewalls of the trench 13 that the semiconductor-containing material 14 is present on. In some embodiments, the semiconductor-containing material 14 that is present on the sidewalls of the trench 13 increases the adhesion of the arsenic-containing layer 16 to the sidewalls of the trench 13, in comparison to similar structures in which the semiconductor-containing material 14 is not present. As indicated above, the semiconductor-containing material 14 is optional and may be omitted, in which the arsenic-containing layer 16 is adsorbed directly to the sidewalls of the trench 13.

The arsenic-containing layer 16 typically includes a monolayer of arsenic. In one embodiment, the monolayer of arsenic may be a layer that is composed of single atoms of arsenic, in which each of atoms in the monolayer has been adsorbed to an atom of the surface on which the monolayer has been formed. For example, each of the atoms of arsenic in an arsenic monolayer may be adsorbed to a single silicon atom of the sidewall of the trench 13. The arsenic atoms tie to the surface atoms of the exposed silicon. In another example, in which a semiconductor-containing material 14 has been deposited on the trench 13 sidewalls, each of the atoms of arsenic in an arsenic monolayer may be adsorbed to a single silicon atom of the semiconductor-containing material 14. The arsenic-containing layer 16 may be approximately 100% arsenic. In one embodiment, the arsenic-containing layer 16 may include multiple layers of arsenic, in which the arsenic monolayers that are formed after the initial arsenic monolayer that is adsorbed to the sidewalls of the trench 13 (or the optional semiconductor-containing material 14) are adsorbed to the preceding arsenic monolayer.

Examples of arsenic-containing gasses that are suitable for depositing the arsenic-containing layer include arsine ($AsH_3$). In one embodiment, the flow rate of the arsenic-containing gas ranges from 80 sccm to 500 sccm. In another embodiment, the flow rate of the arsenic-containing gas ranges from 100 sccm to 300 sccm. The arsenic-containing gas is typically applied to the sidewalls of the trench 13 (or the optional semiconductor-containing material 14), while the structure is at a temperature greater than 400° C. In one embodiment, the temperature of the structure containing the trench 13 is heated to a temperature ranging from 450° C. to 600° C. In another embodiment, the structure containing the trench 13 is heated to a temperature ranging from 525° C. to 575° C. The structure can be heated by a thermal furnace or oven.

The thickness of the arsenic-containing layer 16 deposited by the arsenic-containing gas typically ranges from 5 Å to 30 Å. In another embodiment, the thickness of the arsenic-containing layer 16 that is adsorbed on the sidewalls of the trench 13, or adsorbed on the semiconductor-containing material 14, ranges from 10 Å to 25 Å. In another embodiment, the thickness of the arsenic-containing layer 16 has a thickness that ranges from 10 Å to 20 Å. In one example, the arsenic-containing layer 16 is adsorbed from an arsine gas, wherein the thickness of the arsenic ranges from 10 Å to 20 Å. In one embodiment, the arsenic-containing layer has an arsenic concentration ranging from $1 \times 10^{18}$ atoms/$cm^3$ to $1 \times 10^{21}$ atoms/$cm^3$. In another embodiment, the arsenic-containing layer has an arsenic concentration ranging from $1 \times 10^{19}$ atoms/$cm^3$ to $1 \times 10^{20}$ atoms/$cm^3$.

Figure 8:
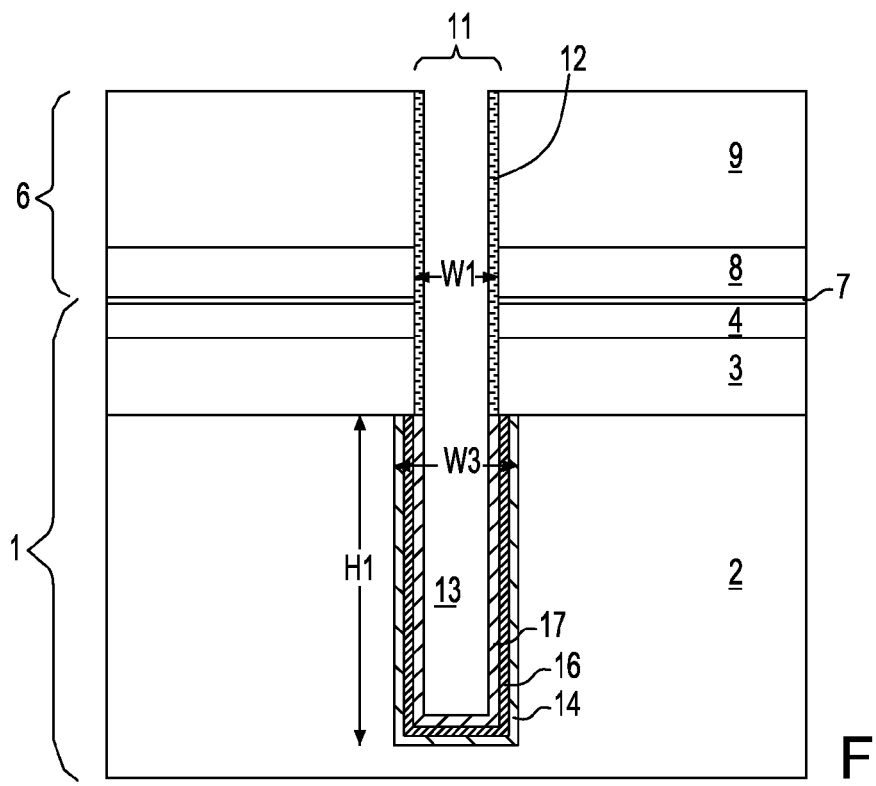
FIG. 8 is a side cross-sectional view depicting forming a material layer to encapsulate the arsenic-containing layer between a semiconductor-containing layer and sidewalls of the trench, in accordance with one embodiment of the present disclosure.

Referring to FIGS. 1 and 8, in a following step 40, an encapsulating layer 17 is deposited on the arsenic-containing layer 16. FIG. 8 is a side cross-sectional view depicting depositing a material layer on the sidewalls of the trench 13 that the arsenic-containing layer 16 is present on to encapsulate the arsenic-containing layer 16 between the encapsulating layer 17 and the sidewalls of the trench 13. By "encapsulate" it is meant that the material of the encapsulating layer 17 is deposited over the entire surface of the arsenic-containing layer 14, so that the arsenic of the arsenic-containing layer 14 is contained within the trench 13. In some embodiments, by encapsulating the arsenic-containing layer 14 outdiffusion of the arsenic is substantially eliminated, which allows for the trench structure including the arsenic-containing layer 14 to be removed from the thermal furnace without introducing arsenic to the ambient atmosphere.

In one embodiment, the encapsulating layer 17 is composed of arsenic silicate glass. The silicate glass may be deposited to provide an encapsulating layer 17 with a conformal deposition process such as, e.g., chemical vapor deposition, plasma enhanced chemical vapor deposition, atomic layer deposition, and combinations thereof In one example, an encapsulating layer 17 composed of arsenic doped silicate glass (ASG) may have an arsenic content ranging from 2 wt. % to 10 wt %.

In another embodiment, the encapsulating layer 17 is composed of an oxide, such as silicon oxide. The silicon oxide may be formed by reacting silicon containing gas precursors with an oxygen-containing gas precursor in a chemical vapor deposition (CVD) method. In one embodiment, the silicon-containing gas precursor may be silane, and the oxygen-containing gas precursor may be nitrous oxide. Variations of chemical vapor deposition (CVD) processes suitable for depositing an oxide, e.g., silicon oxide, encapsulating layer 17 include, but are not limited to, Atmospheric Pressure CVD (APCVD), Low Pressure CVD (LPCVD), Plasma Enhanced CVD (EPCVD), Metal-Organic CVD (MOCVD), and combinations thereof.

In yet another embodiment, the encapsulating layer 17 is composed of a thermal oxide. The thermal oxide may be an arsenic-containing oxide that is formed by introducing oxygen to the arsenic-containing layer 14 using an annealing step in an oxygen-containing atmosphere. In one example, the anneal temperature ranges from 800° C. to 1150° C. In yet another example, the anneal temperature ranges from 800° C. to 1150° C. In some embodiments, the anneal drives arsenic from the arsenic-containing layer 16 into the sidewalls of the trench 13 to form a buried plate electrode 18, as depicted in FIG. 8.

Referring to FIG. 7, in an even further embodiment, the encapsulating layer 17 is formed by depositing a silicon-containing layer and then thermally oxidizing the silicon-containing layer to provide an oxide, such as silicon oxide. The silicon-containing layer may be deposited using chemical vapor deposition. Variations of chemical vapor deposition (CVD) processes suitable for depositing an oxide, e.g., silicon oxide, encapsulating layer 17 include, but are not limited to, Atmospheric Pressure CVD (APCVD), Low Pressure CVD (LPCVD), Plasma Enhanced CVD (EPCVD), Metal-Organic CVD (MOCVD), and combinations thereof. In one example, the silicon-containing layer is silicon that is deposited using a silicon-containing gas precursor, such as silane. Thermal oxidation of the silicon-containing layer may be provided by an annealing step in an oxygen-containing atmosphere. In one example, the anneal temperature ranges from 800° C. to 1150° C. In yet another example, the anneal temperature ranges from 800° C. to 1150° C. In some embodiments, the anneal drives arsenic from the arsenic-containing layer 16 into the sidewalls of the trench 13 to form a buried plate electrode 18, as depicted in FIG. 8.

Referring to FIG. 7, the thickness of the encapsulating layer 17 deposited on the arsenic-containing layer 16 typically ranges from 5 Å to 30 Å. In another embodiment, the thickness of the encapsulating layer 17 deposited on the arsenic-containing layer 16 ranges from 10 Å to 25 Å. In another embodiment, the thickness of the encapsulating layer 17 deposited on the arsenic-containing layer 16 ranges from 10 Å to 20 Å.

In the embodiments, in which an anneal step has been applied that forms an oxide and drives the arsenic from the arsenic-containing layer 16 into the sidewalls of the trench 13, the oxide may be removed by a selective etch process. The etch process for removing the oxide may be selective to the arsenic doped sidewalls of the trench 13 (including the optional silicon-containing material 14). By removing the oxide from the trench 13, a greater trench width is maintained, which facilitates the deposition of material layers within the trench 13 in the following process sequences. In one example, the selective etch is provided by hydrofluoric acid (HF).

Although FIG. 8 depicts a single arsenic-containing layer 16 and a encapsulating layer 17 deposited in the trench 13, it is noted that multi-layers of the arsenic-containing layer 16 and the encapsulating layer 17 may also be formed within the trench. To provide a multiple layers of the arsenic-containing layer 16 and the encapsulating layer 17, the sequence of depositing the arsenic-containing layer 16 and the encapsulating layer 17 may be repeated.

Referring to FIG. 1, at this step 45 of the process flow, it is determined whether the desired arsenic concentration has been deposited within the trench 13. Arsenic concentration depends upon the amount of arsenic that is deposited in the arsenic-containing layer 16. The thickness of the arsenic-containing layer 16 and the number of arsenic containing layers 16, e.g., arsenic-containing monolayers, affect the concentration of arsenic that is deposited in the trench 13. When a single deposition of the arsenic-containing layer 16 does not provide a sufficient concentration of arsenic, the steps 35 and 40 of depositing the arsenic-containing layer 16 and the encapsulating layer 17 may be repeated. It is noted that in some embodiments, any number of arsenic-containing layers 16 and encapsulating layers 17 may be deposited in the trench 13 so long as a node dielectric and upper electrode may also be deposited in the trench 13 when the trench structure is a capacitor.

Referring to FIGS. 1 and 8, in some embodiments, in which the arsenic from the arsenic-containing layer 16 was not driven into the trench sidewalls during the formation of the encapsulating layer 17, once the desired arsenic concentration has been deposited in the trench 13, the process flow continues at step 50 by driving the arsenic from the arsenic-containing layers 16 into the sidewalls of the trench 13 within the base semiconductor layer 2 of the semiconductor substrate 1 to provide the buried plate electrode 18. In one embodiment, the arsenic is driven from the arsenic-containing layers 16 into the sidewalls of the trench 13 using an anneal, such as a thermal anneal, rapid thermal anneal, furnace anneal or laser anneal. In one embodiment, the temperature of the anneal that drives the arsenic from the arsenic-containing layer 16 into the sidewalls of the trench 13 ranges from 750° C. to 1200° C. In another embodiment, the temperature of the anneal that drives the arsenic from the arsenic-containing layer 16 into the sidewalls of the trench 13 ranges from 800° C. to 1150° C. In yet another embodiment, the temperature of the anneal that drives the arsenic from the arsenic-containing layer 16 into the sidewalls of the trench 13 ranges from 850° C. to 1100° C. The width of the buried plate electrode 18 may range from 25 nm to 100 nm, as measured from the sidewall of the trench 13. In one example, the width of the buried plate electrode 18 has a thickness of about 50 nm, as measured from the sidewall of the trench 13.

The anneal that drives the arsenic from the arsenic-containing layer 16 into the sidewalls of the trench 13 can form an oxide on the sidewalls of the trench 13. The oxide may be removed by a selective etch process. The etch process for removing the oxide may be selective to the arsenic doped sidewalls of the trench 13 (including the optional silicon-containing material 14). By removing the oxide from the trench 13, a greater trench width is maintained, which facilitates the deposition of material layers within the trench 13 in the following process sequences. In one example, the selective etch is provided by hydrofluoric acid (HF).

The concentration of the arsenic in the buried plate electrode 18 may range from $1 \times 10^{18}$ atoms/cm$^3$ to $1 \times 10^{21}$ atoms/cm$^3$. In contrast to methods that utilize arsenic doped glass or ion implantation to form a buried plate electrode, the buried plate electrode 18 that is produced by the present method has a uniform dopant concentration throughout the entirety of the sidewalls and base of the trench 13. More specifically, the concentration of the arsenic at the upper surface U1 of the trench 13 sidewall, e.g., at the interface of the buried dielectric layer 3 and the base semiconductor layer 2, is equal to the concentration of the arsenic at the base surface B1 of the trench 13. By "uniform dopant concentration" it is meant that the concentration of arsenic in the buried plate electrode 18 is substantially uniform across the entire depth of the buried plate electrode 18.

Figure 9:
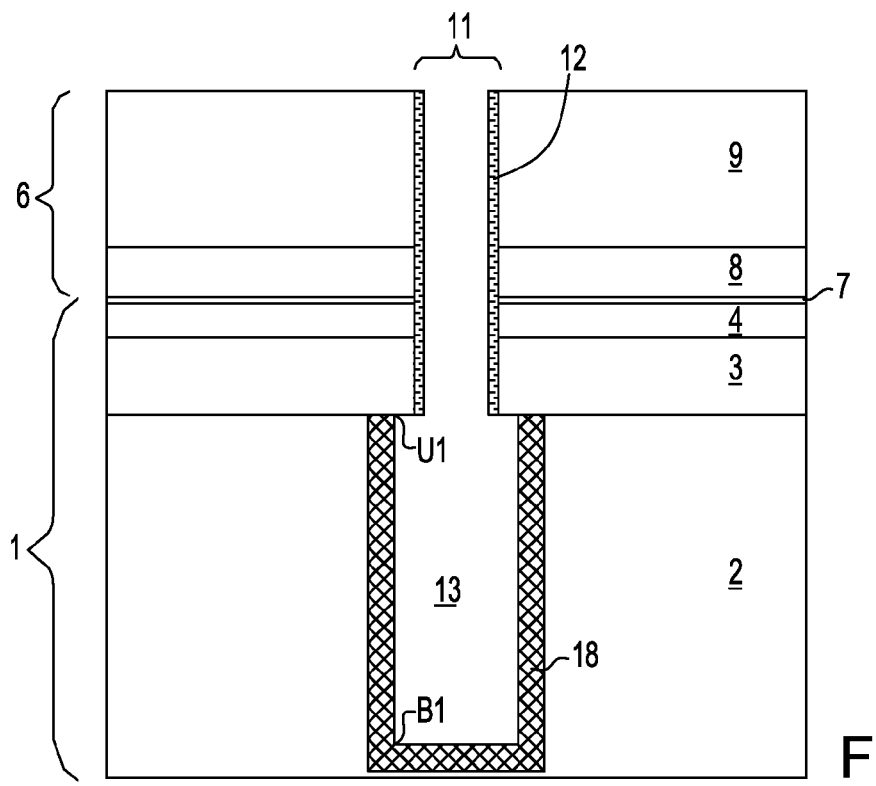
FIG. 9 is a side cross-sectional view depicting driving the arsenic from the arsenic-containing layer into the semiconductor substrate to form a buried plate electrode, in accordance with one embodiment of the present disclosure.
Figure 10:
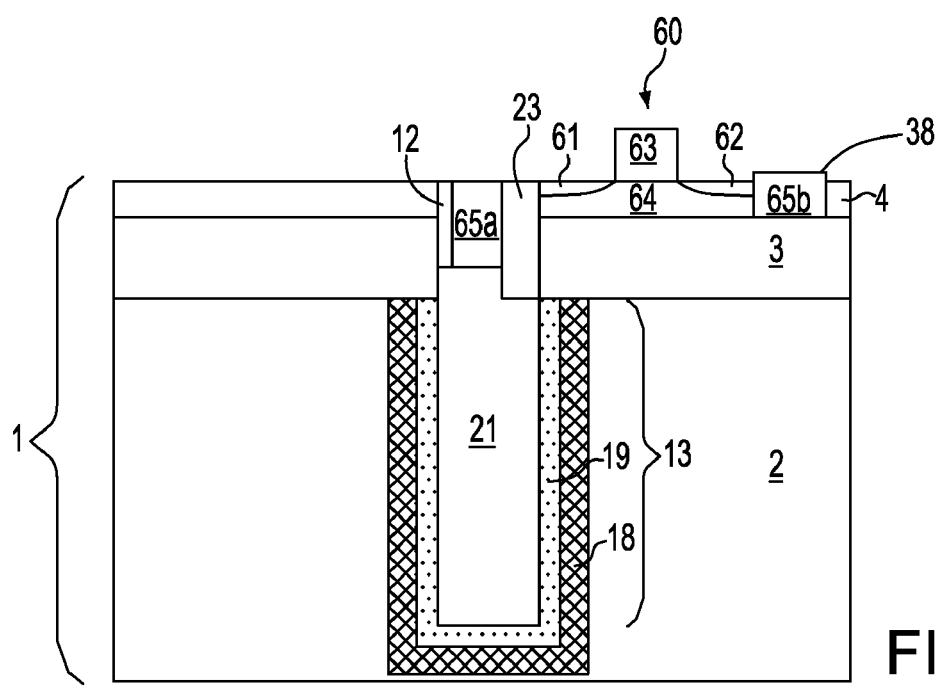
FIG. 10 is a side cross-sectional view depicting a memory device formed from the buried plate electrode depicted in FIG. 9, in accordance with one embodiment of the present disclosure.

The buried plate electrode 18 depicted in FIG. 9 may be employed in a capacitor structure. A "capacitor" is a structure including two electrically conductive materials separated and insulated from each other by a dielectric for storing a charge. The electrically conductive material of the capacitor includes the electrodes, such as the buried plate electrode 18. One example of a capacitor structure that is formed from the buried plate electrode 8 is depicted in FIG. 10. FIG. 10 depicts only one embodiment of a device that can be formed from the method depicted in FIGS. 1-9, and is not intended to limit the present disclosure.

Referring to FIG. 10, a conformal dielectric layer is formed on the buried plate electrode 18 to provide a node dielectric 19 of the capacitor that is formed within the trench 13. The "node dielectric layer" is the dielectric layer that is present between the electrodes of the capacitor. The conformal dielectric layer employed at this stage may be any dielectric material including, but not limited to, $Si_3N_4$, $SiO_2$, $Al_2O_3$, $ZrO_2$, and $HfO_2$. In one embodiment, the conformal dielectric layer may have a thickness of from 4.0 nm to 10.0 nm. The conformal dielectric layer may have a thickness of from 2.5 nm to 7.0 nm, with a thickness of from 3.0 nm to 5.0 nm being more typical.

The node dielectric 19 is conformally deposited on the sidewalls and base of the trench 13 or directly on a conformal metal nitride layer. In one embodiment, the node dielectric 19 may be deposited using chemical vapor deposition (CVD). Variations of CVD processes suitable for providing the node dielectric include, but are not limited to: Atmospheric Pressure CVD (APCVD), Low Pressure CVD (LPCVD), Plasma Enhanced CVD (EPCVD), Metal-Organic CVD (MOCVD), atomic layer deposition, and combinations thereof. In one example, the node dielectric 19 is deposited using atomic layer deposition. In another embodiment, the node dielectric 19 is formed using a growth process, such as thermal oxidation.

Following the formation of the node dielectric 19, an upper electrode 21 is formed atop the node dielectric 19. The upper electrode 21 is composed of a conductive material, such as doped polysilicon or a metal. In one embodiment, the conductive material of the upper electrode 21 may be comprised of polysilicon, doped polysilicon, titanium nitride (TiN), tantalum nitride (TaN), tantalum silicon nitride (TaSiN), tungsten nitride (WN) or a combination thereof. In the embodiments in which the conductive material is provided by doped polysilicon, the dopant may be an n-type or p-type dopant having a dopant concentration ranging from $1 \times 10^{18}$ atoms/cm$^3$ to $1 \times 10^{20}$ atoms/cm$^3$. The conductive material for the upper electrode 21 may be deposited using physical vapor deposition (PVD), such as plating or sputtering, or may be deposited using chemical vapor deposition (CVD). The upper electrode 21 is deposited to fill the trench 13 and the opening.

In one example, the upper electrode 21 is composed of a first layer that is present on the node dielectric 19 that is composed of a metal nitride, such as titanium nitride, and a fill material that is formed on the metal nitride, such as doped polysilicon. Following deposition, the conductive material of the upper electrode 21 may be recessed into the trench 13, in some instances below an upper surface of the buried dielectric layer 3. In one example, in which the upper electrode 19 includes a metal nitride layer and a doped polysilicon fill, the doped polysilicon fill may be recessed with an anisotropic etch process, such as reactive ion etch (RIE). After recessing the polysilicon fill, an etch process that is selective to the doped polysilicon and the node dielectric 19 removes the exposed portion of the metal nitride layer.

In a following process sequence, the node dielectric 19 that extends above the recessed conductive material of the upper electrode 21 is removed from the sidewalls of the first semiconductor layer 4 that provides the trench. In one embodiment, the step of etching the node dielectric 19 includes a wet etch process.

Thereafter, a doped polysilicon region 23 (also referred to as strap region) is formed atop the recessed conductive material of the upper electrode 21, which provides for electrical communication between the upper electrode 21 of the trench memory device and the subsequently formed pass transistors 60. In some examples, the upper surfaced of the doped polysilicon region 23 is recessed relative to the upper surface of the first semiconductor layer 4.

In one embodiment, prior to forming the doped polysilicon region 23, the spacer 12 is removed from at least one side of the SOI layer 4. In one example, the spacer 12 is removed using an anisotropic etch process in combination with an etch mask. For example, a photolithographic mask (not shown) may provide an etch mask by applying a photoresist layer (not shown) on the surface to be etched utilizing a deposition process. The photoresist layer is then patterned utilizing lithography so as to expose selected regions to be etched. In one embodiment, the photolithographic mask is formed overlying a portion of the spacer 12 on one side of the trench 13, wherein a remaining portion of the spacer 12 is not underlying the photolithographic mask and may be exposed. The pad dielectric stack 6 may be removed by selective etch or chemical strip methods. In this embodiment, in which the pad dielectric stack 6 has been removed prior to the removal of a portion of the spacer 12, the etch process step removes the exposed portion of the spacer 12, wherein the portion of the spacer 12 that is underlying the photolithographic mask is protected from the etch process and remains. The etching process for removing the spacer 12 may include reactive-ion etching (RIE), ion beam etching, plasma etching or laser ablation.

In another embodiment, the pad dielectric stack is removed after the portion of the spacer 12 has been removed. In this embodiment, the pad dielectric stack may function as a hard mask. More specifically, the different dielectric layers of the pad dielectric stack, in combination with the photolithography mask and selective etching may be utilized in a multi-stage etch process to remove the spacer 12 from one side of the trench 13. In this embodiment, the portion of the pad dielectric stack overlying the portion of the spacer 12 that is to be removed is etched first to expose the spacer 12. Thereafter, the remaining portion of the pad dielectric stack functions as an etch mask while the exposed portion of the spacer 12 is removed. Following the removal of the portion of the spacer 12, the remaining layers of the pad dielectric stack may be removed.

In a following process sequence, a doped polysilicon region 23 is formed in physical contact with the sidewall of the SOI layer 4 from which the spacer 12 was removed. In one embodiment, the doped polysilicon region 23 is formed by first depositing a layer of polysilicon atop the recessed conductive material of the upper electrode 21, and then doping the polysilicon layer via ion implantation. The polysilicon layer may be deposited using chemical vapor deposition (CVD). The polysilicon layer that provides the doped polysilicon region 23 may then be doped by ion implantation with an n-type or p-type dopant. A typical implant dose for providing the doped polysilicon region 23 is from $1\times10^{15}$ cm$^{-2}$ to $5\times10^{16}$ cm$^{2}$. A typical implant energy range for providing the doped polysilicon region 23 is from 1 to 20 keV. In one embodiment, the doped polysilicon region 23 provides for electrical communication between the upper electrode 21 of the memory devices contained within the trench 13 and the subsequently formed pass transistors 60.

Referring to FIG. 10, and in one embodiment, an isolation region 65a, such as a trench top oxide (TTO), is formed overlying the trench memory devices, e.g. trench capacitor. Forming the isolation region 65a may include an etch process to remove a portion of the doped polysilicon region 23 followed by deposition of an insulating material, such as an oxide, nitride, or oxynitride material. It is noted that in addition to the isolation region 65a that is present overlying the trench memory device, e.g., trench capacitor, other isolation regions 65b may simultaneously be formed through the SOI layer 4.

Referring to FIG. 10, and in a following process sequence, pass transistors 60 are formed on the SOI layer 4 in electrical communication with the trench memory devices, e.g., trench capacitors. In one embodiment, the pass transistors 60 are field effect transistors (FETs), such as n-type and/or p-type FETs. As used herein a "field effect transistor" is a semiconductor device in which output current, i.e., source-drain current, is controlled by the voltage applied to the gate. A field effect transistor has three terminals, i.e., gate, source and drain.

Each field effect transistor (FET) may include a source region 61, a drain region 62, and a gate structure 63, in which a channel region 64 is present underlying the gate structure 63 and is present between the source region 61 and the drain region 62. Typically, the pass transistors 60 are planar devices, in which the length of the channel 64 is parallel to the upper surface of the first semiconductor layer 7, e.g. SOI layer, in which the pass transistor 60 is formed. Typically, at least one of the source region 61 and the drain region 62 of the pass transistors 60 are in electrical communication with the upper electrode 21 of the trench memory device, e.g. trench capacitor, through the doped polysilicon region 23.

Referring to FIG. 10, the capacitor may be employed in a memory device. As used herein, the term "memory device" means a structure in which the electrical state thereof can be altered and then retained in the altered state, in this way a bit of information can be stored. In one embodiment, a memory device is provided that includes a semiconductor on insulator (SOI) substrate (semiconductor substrate 1) including an SOI layer 4 atop a buried dielectric layer 3, wherein the buried dielectric layer 3 is overlying a base semiconductor layer 2; a capacitor 18, 19, 21 present in a trench 13; and a pass transistor 60 present atop the semiconductor on insulator (SOI) substrate is in electrical communication with the capacitor 18,

19, 21. The capacitor 18 includes a buried plate electrode 18 having a uniform arsenic concentration throughout the entire buried plate electrode 18.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a trench structure comprising:
   forming a trench in a semiconductor substrate;
   depositing a semiconductor material on the sidewalls of the trench;
   exposing sidewalls of the trench to an arsenic-containing gas after depositing the semiconductor material on the sidewalls of the trench, wherein an arsenic containing layer is absorbed on the sidewalls of the trench that the semiconductor material is present on; and
   depositing a material layer on the sidewalls of the trench to encapsulate the arsenic-containing layer between the material layer and sidewalls of the trench.

2. The method of claim 1, wherein the semiconductor material has a thickness of 5 Å to 25 Å.

3. The method of claim 1, wherein the material layer is comprised of at least one of arsenic silicate glass, silicon oxide, and an arsenic-containing oxide.

4. The method of claim 1 further comprising annealing to diffuse arsenic from the arsenic-containing layer into the sidewalls of the trench.

5. The method of claim 1, wherein the arsenic-containing gas is comprised of arsine.

6. The method of claim 1, wherein the arsenic-containing layer comprises a monolayer of arsenic atoms.

7. The method of claim 1, wherein the semiconductor substrate is a semiconductor on insulator substrate (SOI) substrate including an semiconductor on insulating (SOI) layer on top of a dielectric layer, wherein the dielectric layer is on top of a base semiconductor layer.

8. The method of claim 2, wherein the semiconductor material is a silicon-containing material that is deposited by a silane-containing gas.

9. The method of claim 3, wherein the silicon oxide is deposited by chemical vapor deposition.

10. The method of claim 4, further comprising at least a second application of arsenic containing gas to the material layer that is present on the sidewalls of the trench to form at least a second layer of arsenic; and at least another deposition of the material layer.

11. The method of claim 4 wherein the annealing to diffuse the arsenic into the sidewalls of the trench provides a lower electrode.

12. The method of claim 5, wherein the arsenic-containing gas is applied to the sidewalls of the trench at a flow rate ranging from 80 sccm to 500 sccm.

13. The method of claim 7, wherein the forming of the trench in the semiconductor substrate comprises an anisotropic etch though the dielectric layer to a depth into the base semiconductor layer.

14. The method of claim 9, wherein the material layer is formed by depositing a silicon containing layer and thermally oxidizing the silicon containing layer.

15. The method of claim 10, wherein the annealing to diffuse the arsenic into the sidewalls of the trench is after a deposition of a final encapsulating material layer and is at a temperature greater than 1000° C.

16. The method of claim 11, wherein the trench structure is an embedded dynamic random access (eDRAM) memory device that comprises a node dielectric on the lower electrode and an upper electrode filling the trench.

17. The method of claim 12, wherein the exposing of the sidewalls of the trench to the arsenic-containing gas occurs at a temperature ranging from 475° C. to 575° C.

* * * * *